United States Patent [19] [11] 3,770,498

Flowers [45] Nov. 6, 1973

[54] PASSIVATING SOLUTION AND METHOD

[75] Inventor: Dervin L. Flowers, Palos Verdes, Calif.

[73] Assignee: Teledyne Semiconductor, a division of Teledyne, Inc., Mountain View, Calif.

[22] Filed: Mar. 1, 1971

[21] Appl. No.: 120,020

[52] U.S. Cl. .................. 117/219, 117/201, 117/215, 117/221, 117/222, 117/223, 117/224, 317/235 AG

[51] Int. Cl. .......................... B44d 1/18, B44d 1/14

[58] Field of Search ............. 317/235 AG; 117/201, 117/215, 221, 222, 224, 223, 219

[56] References Cited

UNITED STATES PATENTS

| | | | |
|---|---|---|---|
| 3,303,399 | 2/1967 | Hoogendoorn et al. | 317/235 AG |
| 3,456,169 | 7/1969 | Klein | 317/235 AG |
| 3,475,210 | 10/1969 | Lehrer | 117/215 |

*Primary Examiner*—Cameron K. Weiffenbach
*Attorney*—Nilsson, Robbins, Wills & Berliner

[57] ABSTRACT

A solution and method for conditioning, gettering and sealing a semiconductor device. Oxides forming a synergistic combination are dissolved in a solvent which is constituted to wet the surface of a semiconductor device. The solution is applied, dried and baked to condition, getter, seal and otherwise passivate the device surface.

11 Claims, 3 Drawing Figures

INVENTOR
DERVIN L. FLOWERS
BY
NILSSON ROBBINS WILLS & BERLINER
ATTORNEYS

PASSIVATING SOLUTION AND METHOD

FIELD OF THE INVENTION

The fields of art to which the invention pertains includes the fields of semiconductor devices, for example, planar and epi planar diffused, mesa, and alloy types, either with or without concomitant passivating coatings such as thermal $SiO_2$, $Si_3N_4$, glass, resins, lacquers, gums, and the like.

BACKGROUND AND SUMMARY OF THE INVENTION

Semiconductor diodes and transistors for use in various signal applications are made to exacting specifications to assure desired electrical characteristics and to provide precise performance. To retain those characteristics, it is necessary to protect the surface of the exposed junctions from conditions which would impair their characteristics or which would otherwise damage or destroy the devices. Surface contaminants, moisture, harmful vapors and changes in surface states are detrimental to the proper operation of semiconductor devices. This detriment behavior is manifest as "soft" or degraded breakdown voltages which are due to the high fields existing at the surface and premature conduction or breakdown under reverse bias due to the lack of dielectric strength of the surface contaminant or surrounding ambient which may adsorb on the surface. Most frequently the deleterious contamination is due to sodium or other alkali metals, e.g., K or Li which under forward bias and on a PN junction migrate to the interface of the oxide-semiconductor device, pile up at the semiconductor junction, and, not being able to sustain the high fields associated with junction peripheries, conduct prematurely. An additional detriment appears when a die is sealed in a whisker package, known in the semiconductor industry as a DO-7 package. This package must be "aged" at an elevated temperature, e.g., 280° C for perhaps 16 hours to obviate the adverse surface electrical effects of mounting the semiconductor die in the DO-7 assembly before sealing. Under conditions of the aging ambient found here, the interfaces between the adhering metallic button effecting the ohmic contact to the package and the semiconductor proper, may be severely degraded, causing loss in forward conduction as well as slight-to-total loss of button adhesion. The interface described here, is frequently, in actual practice a thin (~10 micro inch) layer of a barrier type platinum family metal which is deposited on the semiconductor contact itself after which a silver or perhaps nickel button is grown for ohmic contact with the package itself. Heretofore, it has been determined that when a thin, adherent silicon dioxide film is produced over an exposed PN junction of a semiconductor device, the junction is passivated. Further protection from the action of junction-impairing contaminants has heretofore been obtained by intimately bonding a thin impervious coating of glass to the silicon dioxide film. Prior techniques have included sedimentation of glass powder, sputtering and silicon nitride growth as well as the use of resins, varnishes, silicones, and the like. While these treatments are helpful, imperfections in glassing or trace contaminants often cause a high rejection rate during normal production of the devices. For example, when tested for targeted breakdown voltage and for reverse current after high temperature reverse polarization, yields of acceptable devices lower than 15 percent are often encountered. In terms of finished devices, such low yields represent an immense monetary loss.

Many prior attempts have been made to upgrade these devices by various passivating techniques. For example, in U.S. Pat. No. 3,345,275, Schmidt et al. describes passivation by anodizing silicon using a solution of pyrophoric acid in tetrahydrofuryl alcohol as electrolyte. In U.S. Pat. No. 3,481,029, Wittke describes passivation by treating a metal oxide surface with a water-$Mn(NO_3)_2$-$SiO_2$ sol. In U.S. Pat. No. 3,309,245, Haenichen discloses tha semiconductor devices can be passivated by selectively diffusing phosphorus impurities into p-type silicon, exemplified by phosphorus supplied from a layer of borosilicate glass. In U.S. Pat. No. 3,297,500, Drake et al. discloses that a metal oxide semiconductor device can be passivated by heating the unanodized device at 1,200° C in an atmosphere containing oxygen and water vapor in the presence of vanadium pentoxide to deposit vanadium pentoxide simultaneously with silica film formation. In U.S. Pat. No. 3,476,619, Tolliver discloses passivation of a metal oxide semiconductor device for applying a layer of silicon dioxide containing a phosphorous compound and heating at 350°–900° C. In U.S. Pat. No. 3,476,620, Crishal et al. disclose passivation by codepositing $SiO_2$ and $B_2O_3$ by simultaneous decomposition of ethyl silicate and n-propyl borate at 675°–700° C under reduced pressure, and further describes phosphorous and vanadium as other glass formers. Other prior disclosures of interest are Reinertz U.S. Pat. No. 3,180,755, Moles U.S. Pat. No. 3,287,188, Tombs U.S. Pat. No. 3,422,321, Kerr U.S. Pat. No. 3,457,125 and Nishida et al. U.S. Pat. No. 3,507,716. While each of the foregoing disclosures adds to the art of passivation, there is still not provided a simple, facile, economical method for passivating metal oxide semiconductor devices so as to substantially eliminate low yields. In particular, there is no readily usable, economical method for upgrading rejected devices to an acceptable yield.

By passivate, a process is meant which does any or all of the following: (1) seals the treated surfaces and exposed interfaces; (2) getters, i.e., (*a*) immobilizes alkali and other contaminants and/or (*b*) permits survival, e.g., package sealing, in high sodium, or other alkali, ambients; (3) renders the treated surface inert; and (4) prevents ion migration to the junction.

The present invention provides a passivating solution and method for upgrading rejected devices and for gettering, conditioning and sealing semiconductor devices which is facile, economical and efficiently passivating. In accordance with the present invention, a passivating solution is provided, formulated of passivating oxide in a solvent for dissolving the oxide, the solvent being constituted to wet the surface of the device to be passivated. The solution is applied to the device, evaporated to dryness and the device is heated at moderate temperatures. Following treatment with ammonia to remove excess oxide, the device is dried and can then be packaged in accordance with any prior method to provide a usable device. If the devices are pre-glassed, heating the device can comprise simply baking at about 200° C for several hours. If the devices are not pre-glassed, the baking step can be followed by heat treatment at a higher temperature, e.g., 300°–1,000° C, more particularly 400°–600° C, for a few minutes, to seal the surface of the device. In this latter application one can suitably passivate the device for sealing in a double plug package, which is known in the industry as a DO-35, package without the usual necessity to glass or nitride passivate the surface. In this way one can passivate, for example a very highly gold doped device and keep the gold in the crystal so that ultra high speed diodes may be fabricated for double plug packaging without the need for the usual high temperature glassing or nitride techniques which severely degrade the short lifetime characteristics of gold doped, high speed diodes.

In particular, the passivating material is an oxide of an element chosen from groups IIA, IIB, IIIA, IIIB, IVA, VB, VIA and VIB. The solution preferably contains an oxide of a group VA element, exemplified by the oxides of phosphorous, arsenic, antimony and bismuth. In particular, it has been found that a combination of oxides yields a synergistic effect in that overall performance of the passivating solution is better than the performance obtained when using a solution or dispersion of individual oxides. Phosphorous pentoxide is hygroscopic and when used, it is particularly advantageous to add other, non-hygroscopic oxides. For example, boron trioxide (boron anhydride) can be added to the phosphorous pentoxide. Boron trioxide is normally insoluble in the solvent constituting the solution, but dissolves in the presence of the phosphorous pentoxide and imparts non-hygroscopic properties to the formulation. In further embodiments, another oxide, such as vanadium pentoxide, is incorporated to further improve the efficiency and results of the treatment. In still another embodiment, the process is further improved by the addition of an alkaline earth metal oxide, e.g., group IIA oxide, exemplified by strontium, calcium or barium.

BRIEF DESCRIPTION OF THE DRAWINGS

FIGS. 3A-3C are cross-sectional, diagrammatic views of a wafer containing a plurality of semiconductor devices during various stages of treatment in accordance herewith.

DETAILED DESCRIPTION

Figures 1, 2, 3:
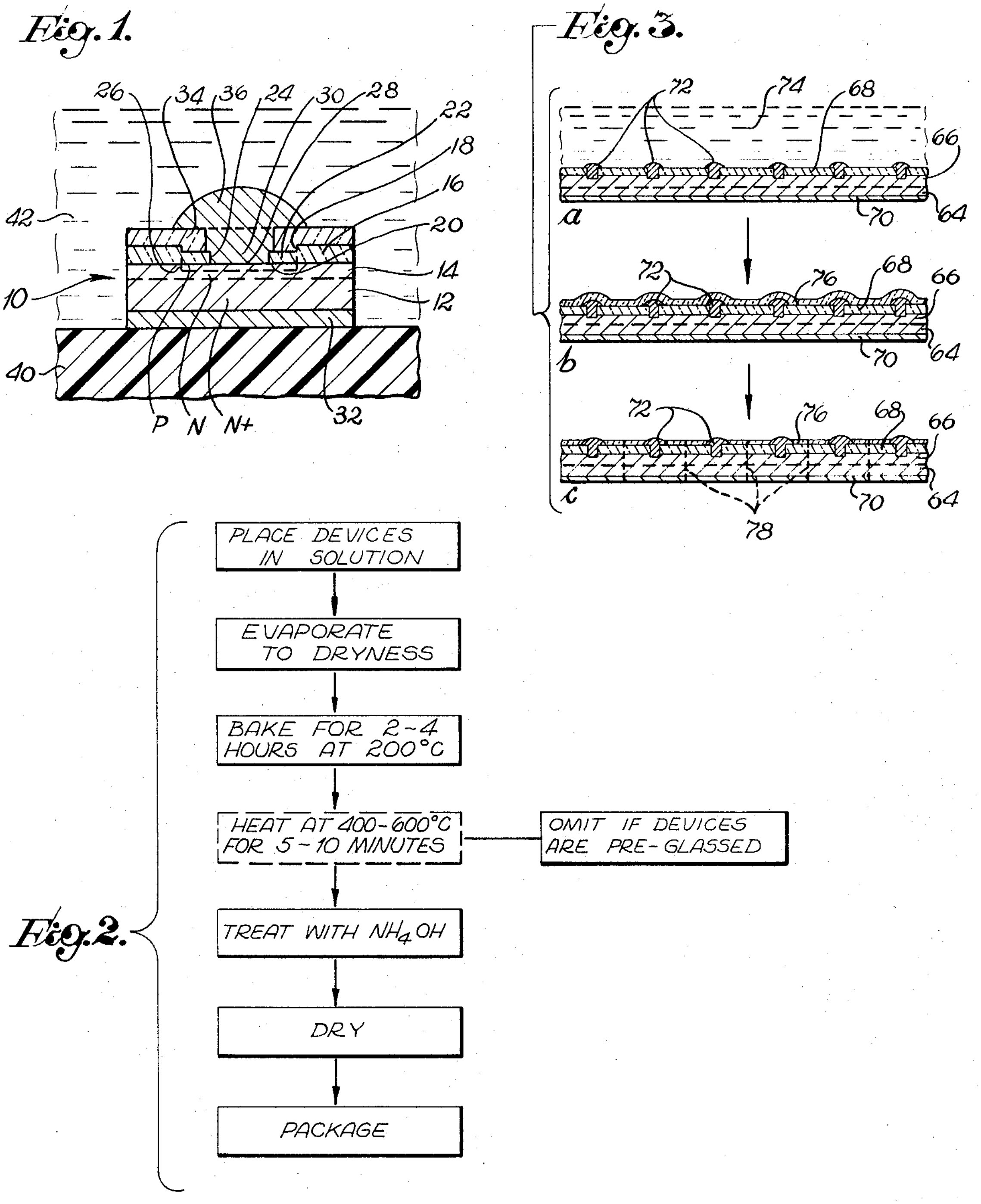
FIG. 1 is a cross-sectional, diagrammatic view of a semiconductor device during the initial stages of treatment in accordance with the present invention.
FIG. 2 is a block diagram illustrating various steps of treatment in accordance with the present invention.

Referring to FIG. 1, a device 10 is illustrated which is typical of the type of devices benefited by the present invention. The passivating solutions to be described are useful to treat all types of semiconductor devices, including silicon devices, germanium devices, devices constructed of group III-V materials such as gallium arsenide and indium antimonide, group II-VI devices such as those constructed of cadmium sulfide, and the like. For purposes of illustration, the device 10 depicted in FIG. 1 represents a silicon semiconductor diode device. The device is a single die, diced from a silicon wafer and is pre-glassed as will be described hereinafter. While a single die is illustrated, it is to be understood that in actual practice several thousand dice are produced simultaneously from a single wafer and are simultaneously treated. The treatment can be applied to the wafer itself prior to dicing and such a process is illustrated in FIGS. 3A-3C to be hereinafter described.

Preparation and glassing of the device of FIG. 1 is not a part of the present invention but will serve to illustrate one type of device which can be benefited. In this particular illustration, the device being treated by this process is already glassed (passivated) and the process when used in this connection getters, conditions and seals any chance contamination or any combination of deleterious ambient conditions which exist between the silver button-glass-semiconductor interfaces and perhaps introduced during processing conditions after glassing itself. Total passivation of the die per se can be accomplished for use in a double stud package without glassing or nitride passivation, i.e., just using the solution technique as described here, and this will be referred to in more detail hereinafter. The device 10 is prepared from a silicon wafer substrate 12 of N+ conductivity type and an epitaxial layer 14 of N conductivity type is grown on the surface of the substrate 12. The epitaxial layer 14 is oxidized to form a silicon dioxide film 16, about 1-2 microns thickness, which is then provided with an opening 18 by means of photochemical masking and subsequent etching, as is well known in the art. A P conductivity type impurity is diffused through the opening 18 to convert a region 20 of the epitaxial layer 14 to P-conductivity type and form a PN junction 26. The opening 18 can then be closed by formation of a second silicon dioxide film 22 which is indistinguishable from the film 16 except for thickness. A second opening 24 is made in the film 22 within the area of the original opening 18, also by photochemical etching, leaving a portion of the second oxide film 22 extending over the PN junction 26 and exposing a surface 28 of the epitaxial layer 14.

A layer of barrier metal, such as platinum or palladium is deposited on the exposed surface 28 of the epitaxial layer 14, as well as on the back of the wafer, by any standard deposition process. An electrical contact metal, such as silver, is next deposited within the area of the second opening 24 in contact with the palladium layer by electroless, electrolytic or evaporative plating, as well known in the art to form a platelet 30 about 1-12 microns thick. Simultaneously, a layer 32 of silver is deposited on the under side of the substrate 12. In accordance with the prior art, a glass film or layer 34 is applied to the exposed silicon dioxide layers 16 and 22, e.g., by sedimentation techniques, followed by a firing process which fuses the particles and intimately bonds the glass to the underlying silicon dioxide layers 16 and 22. The glass can be deposited by sedimentation or by sputtering techniques or may be grown as silicon nitride, all as well known to the art. The glassing step overcoats the silver platelet 30 and this is exposed by means of photochemical etching. An additional volume of silver is plated onto the platelet 30 to substantially extend the volume and form an enlarged silver metal button contact 36.

At this point, the device is fully constructed and may be assembly into a circuit by attaching suitable leads to the button 36 and silver backs 32 or the die may be suitably sealed into a whisker (DO-7) package or double stud (DO-35) package, alone or with other devices. Such packaging involves a variety of complex and costly manipulation steps and as a means of quality control, prior to packaging the entire lot, a selected number of devices are packaged and tested to determine if they will result in satisfactory packages. Such tests are well known to the art and mention may be made of tests in which targeted breakdown voltages ($E_S$), forward current ($I_F$) and a reverse current ($I_B$) before and after forward and reverse polarization, are determined. Forward polarization as mentioned here, is a test to determine if the breakdown voltage and reverse current characteristics of the device will be stable, i.e., unchanged, uninfluenced, by migrating trace ions, such as sodium ions. If the device is operated under conditions of forward bias and elevated temperature for many hours, an inordinate number of devices will usually not pass this test. Reverse polarization tests, as mentioned here, are run with negative bias at elevated temperature for many hours to determine if the breakdown voltage and reverse characteristics are both stable and acceptable. Many devices will not pass this test. Yields of accpetable dice can often be as low as five percent of the dice produced. Such dice are not processed further since the cost of subsequent handling and processing exceeds the value of the acceptable devices obtained from such a lot. Generally, the yield should be at least 40 percent to merit further processing.

In accordance with the present invention, such rejected dice are further treated to upgrade their quality and to increase the usable yield, to the extent that dice in which the initial yield is only 1–15 percent can be upgraded to 75 percent yield or greater. Yields have been improved from 6 percent before treatment to above 90 percent after treatment. Referring to FIG. 2, dice rejected for reasons described above are treated with ammonium hydroxide to clean their surface and dried. They are then "peppered" onto a suitable slab of inert material containing a layer of passivating solution as hereinafter described. When the excess solvent has evaporated, the dice are baked at about 200° C for a suitable period of time, e.g., 2–4 hours. The dice are then ammonia treated to remove excess coating, rinsed, e.g., with methanol, dried, packaged and tested. A multiple treatment as described above is sometimes useful for more severely contaminated dice.

The procedure described just above applies to the upgrading of dice which have previously been glassed or nitride passivated. As will be amplified on with respect to FIG. 3, such prior art passivation can be dispensed with entirely and the dice passivated with the solution only. In this case, one can utilize the process as above described, or as shown by the dashed lines in FIG. 2, one can utilize the 200° C bake in conjunction with an additional 5–10 minute bake of the dice from 400°–600° C before the final ammonia treatment.

It has been found that the foregoing process significantly and drastically increases the yield of acceptable dice in a way not heretofore readily achievable.

Referring now to FIG. 3, as above indicated another method of operation is illustrated in which a plurality of unglassed semiconductor devices are passivated utilizing a solution which can be identical to the solution utilized in the passivation method described with respect to FIGS. 1 and 2. In this embodiment, the treatment seals the devices and replaces the glassing step. Furthermore, in this embodiment the devices are passivated prior to dicing, that is, solution is applied to the wafer prior to scribing and breaking into dice. Such a wafer is illustrated at 64 and is formed generally in accordance with the method described above prior to the glassing step. The wafer 64 is of N+ conductivity type and is formed with an epitaxial layer 66 of N type on which is formed a silicon dioxide film 68. The wafer is photochemically masked and etched to provide a plurality of windows through which P conductivity type impurity is diffused into the epitaxial layer 68 to form PN junctions (too shallow to be illustrated). Further silicon dioxide film is formed to overlap the PN junctions, windows are formed therethrough and palladium and silver are successively deposited on the exposed surfaces of the wafer to form a lower silver contact layer 70 and a plurality of silver contact buttons 72, one button for each device to be subsequently formed by dicing. Typically, a wafer 1.5 inches in diameter will yield about 2,300 devices.

As indicated in FIG. 3A, the wafer is placed in a solution 74 which can be identical to the solution 42 utilized to treat the glassed dice as previously described. Prior to insertion into the solution 74, the wafer is soaked in ammonium hydroxide as a cleaning step. Subsequent treatment, including evaporation to dryness and baking for 2 hours at 200° C follows substantially the procedure set forth above as illustrated in FIG. 2. Additionally, following the bake step at 200° C, the wafers are heated at 550° C for about 5 minutes which seals the surfaces of the devices and provides an overcoating of passivating metal oxides 76 (FIG. 3B). This procedure also seals ohmic interfaces against ambient degradation during aging procedures in DO-7 packages as indicated hereinbefore.

Following the latter heat step, the wafer is treated with ammonium hydroxide as described above, which removes deposited metal oxide passivating agents from the surface of the silver buttons 72, but leaves the oxides deposited on the silicon dioxide surfaces, as shown in FIG. 3C, where they are more tenaciously retained. This step thus allows access to the silver buttons without requiring a photochemical masking and etching step as heretobefore utilized. The wafer is then scribed, as indicated by the dashed lines 78 to dice the wafer and provide the devices as independent components. Each device is then sealed in a suitable package e.g., DO-7 or DO-35, in accordance with prior art techniques to provide an electronic component which is gettered, conditioned and sealed for more reliable performance than heretobefore available on a comparable cost basis. It should be noted that the process steps set forth above are somewhat optimized and that variations including the omissions of many steps can be practiced with good results. The invention in its basic form consists simply of applying the passivating solution to the semiconductor device followed by heating.

Of paramount importance to the success of the foregoing processes is the nature of the passivating solution 42, 74. The solution is formulated of a solvent which is constituted to wet the silicon, metal and oxide surfaces of the devices and which contains passivating oxide dissolved in the solvent. Oxide passivating agents which are usable are those which perform a gettering, conditioning or sealing function, either alone or in combination with other oxides. In particular, the oxides can be oxides of elements chosen from group IIA, IIB,IIIA, IIIB, IVA, VA, VB, VIA and VIB, and mixtures thereof. Thus, one can utilize one or more of the oxides of calcium, strontium, barium and the like; zinc, cadmium and the like; boron, aluminum, gallium, indium, thallium, scandium, yttrium, lanthanum, and the like;

actinium and the like; silicon, germanium, tin, lead; phosphorous, arsenic, antimony, bismuth; vanadium, columbium (niobium), tantalum; selenium, tellurium, polonium; chromium, molybdenum and tungsten. While many of the foregoing elements contain several oxide forms, all of such forms are generally useful, the higher valence oxide forms being preferred.

In accordance with a specific embodiment of this invention, a plurality of passivating oxides can be utilized to obtain synergistic passivation in that by using a combination of certain types of such oxides an overall result is achieved which is more desirable in sum that the results which are achieved by the individual components. Thus, it has been found that phosphorous pentoxide, provides excellent gettering action and excellent passivation, but as a result of its hygroscopic nature, devices so treated may suffer from some hydrolytic instability upon extended storage. On the other hand, oxides which are substantially nonhygroscopic are generally so insoluble in wetting solvents as to be impractical unless they are very finely dispersed and suspended. However, in accordance with this embodiment, when such an insoluble oxide is added to a solution of a group VA oxide, sufficient interaction appears to take place between the components to solubilize a useful amount of the otherwise insoluble oxide. In particular such insoluble oxides include the normally solid oxides of group IIIA elements, such as boron, and group IIB and IVA elements such as germanium, silica and zinc. When the group VA oxide is phosphorous pentoxide, the interaction with boron trioxide, for example, eliminates any hygroscopic effect.

It will be recognized that the nature of such interaction may be quite complex and it is not intended to rely on any particular theory of operation. With this in mind, it may be theorized that to the extent that the group VA oxide is hydrolyzed to an acid, an odd pair of electrons on the hydroxy oxygen of such acid, having a large affinity for the hydrogen of water, attracts the water and chemically adsorbs it. For example, with phosphorous pentoxide, boron trioxide appears to interact as anhydride boric acid with the phosphoric acid and upon heating results in transanhydride formation, "capping" the acidic hydrogens of the phosphoric acid and eliminating its acid character. This interaction can explain the solubility of the boron trioxide in a solvent in which it is insoluble in the absence of the dissolved group VA trioxide. The result is a binary mixture possessing excellent gettering, conditioning and sealing properties. The oxides of arsenic, antimony and bismuth can replace part or all of the phosphorus pentoxide. Germanium dioxide, silicon dioxide and zinc oxide can supplement or can replace part or all of the group IIIA oxides. These latter oxides are not soluble in the presence of phosphorous pentoxide but can be dispersed therewith. It should be noted that the combination of oxides can be pre-mixed so as to constitute a single oxide component. For example, oxides of phosphorus and of boron can be added separately or as a single material which can be called boron phosphate ($BPO_4$).

It has also been found that still another type of insoluble, non-hygroscopic oxide can be added following formulation of the above binary addition, to formulate a ternary or greater mixture of oxides having even further improved properties. Such "second added" oxide is not soluble in the solvent even in the presence of the group VA oxide, but it has been found that a double synergism exists in that such second added oxide can be dissolved to a useful extent when both the group VA and interacting non-hygroscopic oxide are present in the solution. For example, vanadium pentoxide has no useful solubility in isopropanol solution of phosphorus pentoxide, but it is soluble if boron trioxide is also present, and significantly contributes to the passivating properties of the formulation. In other words, phosphorus pentoxide is soluble in isopropyl alcohol which then allows boron trioxide to go into solution. The soluble boron trioxide-phosphorus pentoxide then allows vanadium pentoxide to go into solution. It should be noted that the vanadium pentoxide does not go rapidly into solution but when left standing for some time, for example 16 hours, sufficient amounts go into solution to substantially further improve the properties of the solution. Other such "second" oxides are other oxides of group VB elements such as vanadium trioxide, columbium pentoxide and tantalum pentoxide; and group VIB oxides such as tungsten dioxide and tungsten trioxide.

It has further been found that if 0.001 to 0.5 weight percent of the oxide of calcium, strontium or barium is added, an additional 5–30 percent improvement in the electrical yield may be obtained.

In general, any solvent can be utilized which can wet the surface of a semiconductor device and which does not deleteriously react with the passivating oxide or is deleteriously affected thereby. For example, one can use polar organic solvents such as methanol, ethanol, isopropanol, nitromethane, 1,4 dioxane, dimethyl sulfoxide, tetrahydrofuran or other ethers, water, aromatic solvents such as toluene, benzene, chlorobenzene, nitrobenzene, basic hydrocarbons such as ethylamine, triethylamine, pyridine, aniline, solvents such as carbon tetrachloride, chloroform, dimethylformamide, trichloroethylene and carbon disulfide and the like or mixtures thereof. When solvents with a carbonyl group, such as esters, aldehydes and ketones are used, a reaction can occur, resulting in the formation of deterioration products which can interfere with the passivating effect of the oxides. When water is utilized as a solvent, it should be mixed with a better wetting solvent and/or with a surfactant, such as Aerosol OT, trade name for dioctyl sodium sulfosuccinate. Any other commercial surfactant can be used. Generally it is desirable to utilize a solvent which can wet both the semiconductor metals, semiconductor oxide and silver. Isopropyl alcohol and the other alcohols are particularly suitable in this regard. Generally, the solution includes about 0.01 to about 10 weight percent of total dissolved or dispersed oxides. It is convenient to prepare a stock solution at about twice that concentration, which can be diluted for use, such stock solution appearing to be somewhat more stable than the diluted solution. In terms of relative concentration, where a mixture of oxides is used, from about one to about 1 parts of first added oxide can be utilized per part of group VA oxide. In a ternary system, the amount of second added oxide is generally less, about 0.01 to about one part per part of group VA oxide. Group IIA oxides can be added to the extent of about 0.01 to about one part per part of group VA oxide.

In the particular solution 42 or 74 referred to in FIGS. 1 and 3, 1.73 weight percent phosphorus pentoxide, 3.30 weight percent boron trioxide and 0.098 weight percent vanadium pentoxide were dissolved in absolute isopropanol to form a stock solution which was dissolved with an equal part of absolute isopropanol when used. With dice treated with this solution and the procedure of FIG. 2, and sealed in device packages, no deteriorating effect was found in accelerated aging tests or as a result of continuous and extended high temperature operating conditions. After actual storage for several months prior to sealing, $E_S$, $I_F$ and $I_B$ (reverse and forward polarization) results were essentially identical to the results originally obtained. Accordingly, a solution and procedure have been provided requiring minimum heat treatment and minimum expense but resulting in an upgrading and restoration of electrical properties representing a dramatic improvement over the art. The passivating procedure is particularly useful for hyperfast devices as a result of the generally low temperature requirements in utilizing the solution. Such devices are generally very highly gold doped to achieve rapid switching characteristics. Excessive temperatures, i.e., >550° C rapidly remove gold from the device crystal thus deleteriously affecting its switching speed. The process of this invention is particularly advantageous here because it is a low temperature passivating process.

The procedure seals ohmic interfaces against ambient degradation during aging and gives greater yield and long term use stability to all types of devices in all kinds of packages. Such degradation most specifically refers to a loss of forward conduction upon aging the sealed units at an elevated temperature, e.g., 270° C for 10 hours. This loss of forward conduction is associated with a decrease in the adhesion of the silver button of the device to the ohmic contact with or without concomitant loosening of the platinum or palladium platelet adhering to the semiconductor surface.

The following examples in which all parts are by weight will illustrate various aspects of the invention.

EXAMPLES 1–7

Stock solutions for dilution were prepared by adding the oxide or oxides referred to in Table I to isopropanol (IPA) at 5 times the concentration levels indicated in Table I. Where oxides in addition to phosphorus pentoxide were used, the phosphorus pentoxide was added first to the isopropanol and the solution was allowed to stand until the phosphorus pentoxide completely dissolved. Thereafter the boron trioxide was added with stirring until dissolved. Vanadium pentoxide when added followed the boron trioxide. After the stock solution was prepared one part was diluted with four parts of isopropanol to provide the passivating solution.

The dice to be treated were taken from a common reject dice lot which was found to be commercially unacceptable. Tests were conducted on packaged samples of the dice as shown in the Table and as will be discussed hereinafter. The dice were cleaned in ammonium hydroxide, rinsed with distilled water, followed by methanol and then dried. The passivating liquid was poured onto the top of a polytetrafluoroethylene (PTFE) block and dice were peppered into the solution. The dice were air dried until no discrete liquid was left. The PTFE block with adhering dice was placed in an oven where it was baked at 200° C for four hours. The assembly was removed and cooled and the dice were soaked for about 10 minutes in ammonium hydroxide, rinsed with methanol and dried.

The treated dice were then sealed in a package immediately, except where other time is indicated, and tested to determine the percentage of dice having a targeted breakdown voltage ($E_S$) yield, forward current ($I_F$) yield and reverse current ($I_B$) yield. $E_S$ yields were obtained by determining the percentage of dice conducting less than 10 microamps at a reverse voltage of −50 volts. $I_F$ was obtained by determining the percentage of dice having a stable conduction of greater than 300 milliamps in a forward direction at one volt. $I_B$ was obtained by determining the percentage of dice conducting less than 50 nanoamps after reverse polarization for 16 hours at −50 volts, at room temperature. Each of the tests was conducted in triplicate. Overall yield is determined by simply multiplying the individual yields. Table I lists the type of treatment involved and test results.

TABLE I

| Ex. | Solution | Yields, % $E_S$ | $I_F$ | $I_B$ | Overall Yield, % |
|---|---|---|---|---|---|
| — | Control, no processing | 28± 7 | 85 | 10 | 2.4 |
| — | IPA only | 30± 3 | 95 | 60 | 17.1 |
| 1. | <1% $B_2O_3$ in IPA | 44± 8 | 90 | 65 | 26 |
| 2. | 1% $P_2O_5$—1 hour IPA solution, 1 hour dice | 92± 1 | 90 | 90 | 75 |
| 3. | 1% $P_2O_5$—24 hours IPA solution, 1 hour dice | 92± 4 | 90 | 85 | 70 |
| 4. | 1% $P_2O_5$— 24 hours IPA solution, 24 hours dice | 89± 4 | 90 | 90 | 72 |
| 5. | 1% $(3B_2O_3/IP_2O_5)$, 3 hours IPA solution | 79± 3 | 100 | 70 | 55 |
| 6. | 1% $(3B_2O_3/IP_2O_5)$, 0.2% $V_2O_5$, 24 hours IPA solution | 85± 5 | 100 | 90 | 77 |

Referring to Table I, without processing, the dice suffered a 72 percent loss of yield as a result of unacceptable breakdown voltage and the remaining good units an additional 90 percent loss after reverse polarization testing. In addition, there was a 15 percent loss due to units with insufficient forward current. The net overall yield was 2.4 percent. When the dice were treated with isopropanol only, reverse polarization results were helped somewhat but the overall yield only increased to about 17.1 percent, which is still unacceptable. In Example 1, an attempt was made to determine the effect of boron trioxide. However, no detectable amount of boron trioxide dissolved in the isoproponal although some of the finer particles remained suspended. At the completion of the experiment the overall electrical yield showed an upgrading from 2.4 percent to about 26 percent with the breakdown voltage yield improving from 28 percent to 44 percent. Thus some beneficial activity was shown due to the boron, limited by the lack of solubility and dispersion of only a very small part of the amount added.

In Examples 2–4, the results of using phosphorus pentoxide as the passivating oxide is shown and it is seen that very dramatic upgrading occurs in all parameters so that overall yields of 70–75 percent are achieved. As a result of such treatment, dice which were virtually unacceptable for utilization as electronic components have been converted to commercially, very useful material. In Examples 2 and 3, the age of the solution was varied from 1 hour to 24 hours with no significant affect on the efficacy of the treatment. In Example 4, the dice were stored for 24 hours prior to sealing and it is seen that a minor amount of breakdown yield loss occured. However, of more importance, the surfaces of the dice appeared to be very hygroscopic with the dice sticking and clumping making dice removal from the PTFE block difficult. Furthermore, when such dice are sealed in a package several hours after treatment, some ohmic degrades are found which are not present in dice which are sealed immediately after treatment. Accordingly, when phosphorus pentoxide or other hygroscopic oxide is used as the sole passivating agent, the dice should be sealed as soon as possible after treatment.

In Example 5, the dice were treated with a combination of phosphous pentoxide and boron trioxide. The overall electrical yield was greatly improved from the control samples, but was not as improved as when phosphorus pentoxide alone was used, the decrease in improvement being distributed between the breakdown voltage yield and reverse current yield. However, and importantly, the dice are not hygroscopic. After several weeks storage, excess coating from the phosphorus pentoxide-boron trioxide treatment shows no evidence of wetness and the dice do not clump. After sealing, such dice do not show significant ohmic degrades.

The affect of the addition of vanadium pentoxide is shown in Example 6. 0.2 percent of vanadium pentoxide was added to a solution of the type shown in Example 5. After about one hour, the vanadium pentoxide had not gone into solution to any great extent and the solution was colorless. However, when the solution was allowed to stand for 16 or more hours enough of the vanadium pentoxide went into solution to turn its color very bright yellow. The solution was applied after 24 hours and showed a very beneficial upgrading of the dice, restoring substantially all of the advantages obtained from the treatment of the dice with phosphorus pentoxide alone, but without hygroscopicity. When vanadium pentoxide is added to isopropanol alone, or isopropanol containing only phosphorus pentoxide, insufficient vanadium pentoxide is dissolved or dispersed to be useful.

EXAMPLE 7

An isopropanol solution containing 0.3% phosphorus pentoxide as well as a dispersion of 0.75% germanium dioxide powder and 0.02% vanadium pentoxide was utilized as the passivating material. When used as in Examples 1–6 to restore a reject glassed dice sample with only an 11% electrical yield, the resulting overall electrical yield was 98%.

EXAMPLE 8

The solution suspension of Example 7 was used as the passivating material on a non-glassed dice sample and the treated dice sealed in a double plug package. Without the solution treatment the electrical yield was zero. With the solution treatment, the overall electrical yield was 88 percent.

EXAMPLE 9

A solution can be prepared as in Example 7 but in place of the germanium dioxide powder, one can use 0.75% silicon dioxide powder to provide a passivating solution imparting increased electrical yield, in accordance with this invention, to a reject glassed dice sample.

EXAMPLE 10

A solution can be prepared as in Example 8 but in addition containing 1% zinc oxide powder to provide an enhanced passivating solution useful in accordance with the methods herein.

EXAMPLE 11

A solution can be prepared as in Example 5 but in addition containing 0.2% barium oxide powder to provide an improved passivating solution.

EXAMPLE 12

A solution can be prepared as in Example 3 but in addition containing 0.1% calcium oxide power to provide an improved passivating solution which can be used to significantly increase the electrical yield of reject dice.

EXAMPLE 13

A solution can be prepared as in Example 5 but in addition containing 0.5% strontium oxide powder to enhance the passivating affect of the solution.

EXAMPLES 14–18

Passivating solutions utilizing various solvents were formulated by adding, with stirring, and in order, 1.73 weight percent phosphorus pentoxide, 3.30 weight percent boron trioxide, and 0.098 weight percent vanadium pentoxide in various solvents as listed in Table II. The formulations were stirred and stored for at least one day prior to use to allow vanadium pentoxide to dissolve to at least some extent. The result was a stock solution which for purposes of testing was diluted with two parts of the solvent to one part of the stock solution. Dice from an unacceptable lot were treated with the solutions in accordance with the procedures set forth with respect to Examples 1–7. The results of testing dice so treated are given in Table II.

TABLE II

| Ex. | Solution plus 0.58% $P_2O_5$, 1.10% $B_2O_3$, 0.03% $V_2O_5$ | $E_S$ Yield, % |
|---|---|---|
| — | Control, no processing | 15 |
| 14. | isopropanol | 62 |
| 15. | methanol | 72 |
| 16. | methanol ± 5 drops AOT | 80 |
| 17. | $H_2O$ ± 2 drops AOT | 62 |
| 18. | toluene | 40 |

A control was tested, which was not processed, which showed that the dice lot had a breakdown voltage yield of only 15 percent. As shown in Example 15, as a result of passivation with an isopropanol-oxide solution, the yield was increased to 62 percent. In Example 16, when the dice were passivated with the methanol-oxide solution, the yield was raised even further to 72 percent. Furthermore, as in Example 17, when five drops of 1% Aerosol OT surfactant solution were added to the methanol, it increased the yield to 80 percent, dramatically illustrating that the ability of the solvent to wet the surfaces of the device is important to its operation.

When water alone is used as a solvent for the passivating oxides, the diced devices are not wet by the solution. When the dice are sprinkled into the solution they turn backs up and float. However, when only two drops of the 1% Aerosol OT solution were added to the water, the dice flipped over and sank and, as shown in Example 18, were passivated to the extent of upgrading the yield from 15 percent to 62 percent.

As seen in Example 18, when toluene is used as the carrier solvent, some upgrading to a yield of 40 percent is obtained. Lack of greater success can probably be attributed to the generally poor solubility of the oxides in such a pure aromatic hydrocarbon.

As required, detailed illustrative embodiments of the invention have been disclosed. However, it is to be understood that these embodiments merely exemplify the invention which may take many forms substantially different from the specific illustrative embodiments disclosed. Therefore, specific details are not to be interpreted as limiting, but merely as a basis for the claims.

I claim:

1. A method for passivating a semiconductor device which includes the steps of:

preparing a formulation by dissolving a passivating amount of at least one oxide of an element, selected from Groups IIA, IIB, IIIA, IIIB, IVA, VA, VB, VIA and VIB of the periodic table, in a solvent substantially free of carbonyl groups and capable of wetting the semiconductor surface to be passivated of said semiconductor device;

applying said formulation to said surface; and heating said surface with said applied oxide thereon to form a passivating layer of said oxide.

2. The method according to claim 1 in which said passivating amount is about 0.01–10 weight percent of said solution.

3. The method according to claim 2 in which said solvent is an alcohol.

4. The method according to claim 2 in which said surface to be passivated is pre-coated with glass.

5. The method according to claim 2 in which said surface to be passivated is substantially unglassed and said device is heated at about 300° C or higher.

6. The method according to claim 2 in which said oxide is an oxide of a group VA element, said passivating amount thereof is soluble in said solvent, and said solution contains in addition to said group VA oxide at least one additional oxide including an oxide of a second element which alone is insoluble in said solvent but is soluble in a solution containing said group VA oxide, the amount of said second oxide being 1–10 parts per part of said group VA oxide.

7. The method according to claim 6 in which said solution contains at least 0.01 part of a third metal oxide per part of said group VA metal oxide, said third metal oxide being insoluble in said solvent in the presence alone of said group VA oxide, but soluble in the presence in said solvent of both said group VA oxide and said second metal oxide.

8. The method according to claim 6 in which said group VA metal oxide is an oxide of phosphorus.

9. The method according to claim 8 in which said oxide of a second element is an oxide of boron.

10. The method according to claim 9 in which said solution contains at least 0.01 part of an oxide of vanadium per part by weight of said oxide of phosphorus.

11. The method according to claim 9 in which said surface to be passivated is pre-coated with glass.

* * * * *

UNITED STATES PATENT OFFICE
CERTIFICATE OF CORRECTION

Patent No. 3,770,498 Dated November 6, 1973

Inventor(s) Dervin L. Flowers

It is certified that error appears in the above-identified patent and that said Letters Patent are hereby corrected as shown below:

Column 8, line 58, change "1" to "10".

Column 12, line 42, change "±" to "+".

Column 12, line 43, change "±" to "+".

Signed and sealed this 13th day of August 1974.

(SEAL)
Attest:

McCOY M. GIBSON, JR.
Attesting Officer

C. MARSHALL DANN
Commissioner of Patents